(12) United States Patent
Noble

(10) Patent No.: US 6,190,950 B1
(45) Date of Patent: Feb. 20, 2001

(54) DENSE SOI PROGRAMMABLE LOGIC ARRAY STRUCTURE

(75) Inventor: Wendell P. Noble, Milton, VT (US)

(73) Assignee: Micron Technology, Inc., Boise, ID (US)

( * ) Notice: Under 35 U.S.C. 154(b), the term of this patent shall be extended for 0 days.

(21) Appl. No.: 09/373,357

(22) Filed: Aug. 12, 1999

Related U.S. Application Data

(62) Division of application No. 09/042,795, filed on Mar. 17, 1998, now Pat. No. 6,046,477.

(51) Int. Cl.⁷ .................................................. H01L 21/00
(52) U.S. Cl. ..................... 438/149; 438/164; 438/412; 438/479; 438/154
(58) Field of Search ............................... 438/149, 151, 438/156, 164, 411, 412, 479, 517, 154

(56) References Cited

U.S. PATENT DOCUMENTS

| | | |
|---|---|---|
| 4,561,932 | 12/1985 | Gris et al. . |
| 4,604,162 | 8/1986 | Sobczak . |
| 4,615,746 | 10/1986 | Kawakita et al. . |
| 5,055,898 | * 10/1991 | Beilstein, Jr. et al. ............... 436/155 |
| 5,397,904 | * 3/1995 | Arney et al. ............................ 257/66 |
| 5,479,048 | * 12/1995 | Yallup et al. ......................... 257/621 |
| 5,691,230 | 11/1997 | Forbes . |
| 5,732,014 | * 3/1998 | Forbes ................................... 365/149 |
| 5,889,306 | * 3/1999 | Christensen et al. ................. 257/350 |
| 5,909,618 | * 6/1999 | Forbes et al. ......................... 438/156 |

* cited by examiner

Primary Examiner—Kevin M. Picardat
(74) Attorney, Agent, or Firm—Dickstein Shapiro Morin & Oshinsky LLP

(57) ABSTRACT

A semiconductor device array having silicon device islands isolated from the substrate by an insulator. High array density is achieved by forming source and drain interconnects in the space between the islands. Also disclosed are processes for forming and programming such arrays.

21 Claims, 4 Drawing Sheets

DENSE SOI PROGRAMMABLE LOGIC ARRAY STRUCTURE

This application is a divisional of application Ser. No. 09/042,795 Filed on Mar. 17, 1998, now U.S. Pat. No. 6,046,477 which is hereby incorporated by reference.

FIELD OF THE INVENTION

The present invention relates to an improved semiconductor structure for high density device arrays, such as ROMs, programmable logic arrays or memory decode arrays. In particular, this invention relates to a Silicon-On-Insulator (SOI) array of fully isolated device islands that can be implemented with a small feature size, and a process for its formation.

BACKGROUND OF THE INVENTION

SOI technology provides many advantages when used in Complementary Metal-Oxide-Semiconductor (CMOS) Integrated Circuits (ICs). One primary advantage is a significant reduction of parasitic capacitance between a source/drain and a substrate. Other major advantages include elimination of latch-up, reduction of chip size and/or increased device density, and increased circuit speed. SOI devices also have lower power requirements and higher speeds compared to non-SOI devices, making SOI technology popular for use in battery-operated equipment.

The advantages of SOI structures result from the total isolation of the device islands from the substrate. Total isolation has been achieved using a sapphire substrate instead of a semiconductor substrate, but the resultant product is expensive and the quality of the crystalline silicon grown on sapphire is usually poor. Processes to achieve device-substrate isolation using a silicon substrate are known, but such processes may not achieve total isolation, and may cause defects in the resultant structures.

SOI structures may be formed through a variety of processes, including SIMOX, wafer bonding, FIPOS and etch and oxidation processes. Separation by Implanted Oxygen (SIMOX) involves oxygen ion implantation into a silicon substrate to form a buried oxide insulating layer. This method is expensive and has the disadvantage of damaging the crystalline structure of the silicon above the insulating layer due to the passage of high energy oxygen ions.

Wafer bonding is another technique for forming an isolation layer in a substrate. It involves the fusing together of two oxidized silicon wafers in a high-temperature furnace. However, wafer bonding is an undesirable technique because it increases the substrate thickness, and has low production yields due to voids and particles interfering with adequate bonding between the wafers.

The Full Isolation by Porous Oxidized Silicon (FIPOS) process forms an insulating layer through the initial formation of a doped layer in the silicon substrate, covered with a layer of undoped epitaxial silicon. The substrate is then anodized to create a porous layer of silicon under islands of undoped silicon in the substrate. The FIPOS process is slow and expensive, and produces a substrate with a tendency to warp or curl due to the thermal stresses it has undergone.

Another known technique used to form an isolation layer is a series of etch and oxidation steps used to create silicon islands, as described in U.S. Pat. No. 4,604,162. Islands are formed by the etching and subsequent partial undercutting of the islands. Silicon filaments maintain the connection of the islands to the substrate during the undercutting step, and the subsequent thermal oxidation step. During thermal oxidation, which creates an isolation layer under the islands, expansion of the oxide subjects the islands to substantial mechanical stress and crystal damage. The silicon filaments connecting the islands to the substrate are also under tensile stress that creates dislocations of the islands, resulting in high junction leakage and low carrier mobility.

In addition to the isolation of the devices from the substrate, it is also important to isolate the devices from each other. The use of silicon device islands with isolation trenches is known, but such devices typically do not have a high functional density. As the minimum feature size decreases, the number of devices in a chip area (active device density) increases, but the area occupied by interconnection lines on the chip surface minimizes the number of interconnected devices in a chip area (functional density). To be effective, a high density device array should maximize both active device density and functional density.

There is a need for a fully isolated high density semiconductor structure suitable for use in, e.g., ROMs, programmable logic arrays, or memory decode arrays.

SUMMARY OF THE INVENTION

The present invention provides a fully isolated semiconductor structure that has a high density and is suitable for use in ROMs, programmable logic arrays, or memory decode arrays. The present invention permits effective isolation between devices and reduces the area occupied by interconnection lines on the device surface.

In addition, the present invention provides a process for fabricating an isolated structure that minimizes damage to the structure and avoids dislocations during the isolation process.

Advantage and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms wafer or substrate used in the following description include any semiconductor-based structure having an exposed silicon surface in which to form the silicon-on-insulator structure of this invention. Wafer and substrate are to be understood as including silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation. The following detailed description is, therefore, not to be taken in a limiting sense, and the scope of the present invention is defined by the appended claims.

Figure 1:
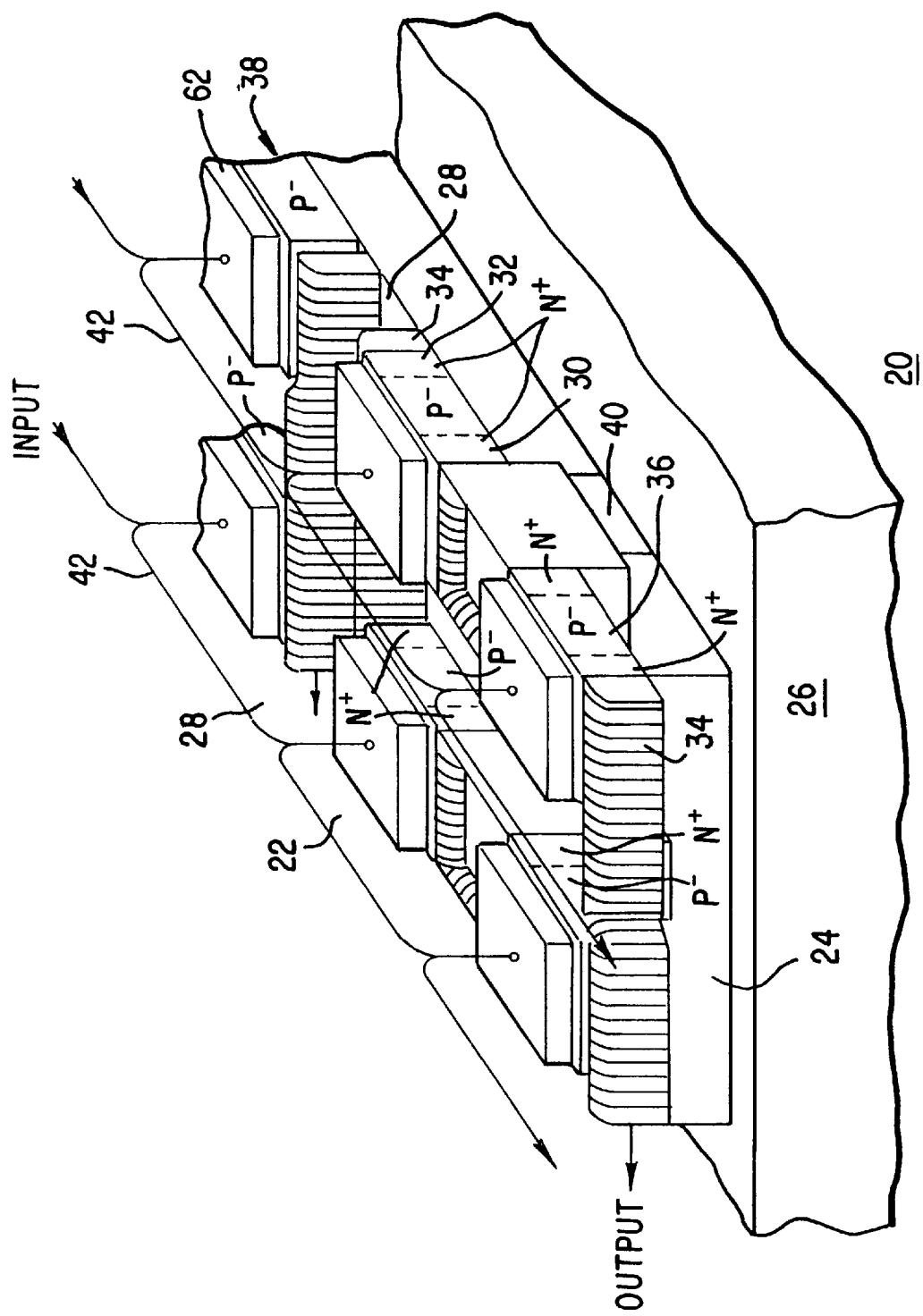
FIG. 1 is a perspective view of a device array constructed in accordance with a preferred embodiment of the invention.

Referring now to the drawings, where like elements are designated by like reference numerals, an embodiment of the device array 20 of the present invention is shown in FIG. 1. The device array 20 is comprised of a plurality of silicon islands 22 resting on an insulation layer 24 of silicon dioxide on top of a silicon substrate 26, where the silicon islands 22 are separated from each other by isolation trenches 28. Each silicon island 22 has dimensions of one F by one F, and each isolation trench 28 is preferably one F wide, where F is the feature size, e.g., 0.25 $\mu$m. Each silicon island 22 is a device, such as a transistor, capacitor or other single-function component. Thus, with the inclusion of island to island isolation, the area per programmed device cell is $4F^2$ (2F×2F).

The silicon islands 22 have doped regions diffused into their sides, such as the source n-regions 30 and drain n-regions 32 shown in FIG. 1. Polysilicon drain lines 34 run within the isolation trenches 28 on the drain side of the silicon i slands 22. If the drain n-region 32 of a silicon island 22 is connected to the polysilicon drain line 34, that silicon island is a contacted device 36, and if it is not connected, it is a non-contacted device 38. The source n-regions 30 of the silicon islands 22 form source contacts to the silicon substrate 26 through a contact plug 40 made from a refractory metal and located within alternate parallel isolation trenches 28. Gate conductor lines 42 connecting individual silicon islands 22 are metal wires running orthogonal to the polysilicon drain lines 34.

There are three sets of interconnects in the device array 20. The contact plug 40 serves as a source interconnect, the polysilicon drain line 34 serves as a drain interconnect, and the gate conductor lines 42 serve as gate interconnects. A high density array is achieved by locating one or more of these interconnects in the isolation trenches 28, thereby utilizing this normally empty space. Even though the preferred embodiment of the device array 20 places the source and drain interconnects in the isolation trenches 28, island-to-island isolation is maintained by the insulation layer 24 and by careful design of the device array 20.

The device array 20 is manufactured through a process described as following, and illustrated by FIGS. 2 through 9. First, a silicon substrate 26 is selected as the base for the device array 20. The silicon substrate 26 may be doped or undoped, but a doped wafer is preferred. Next, a gate oxide layer 60 is grown on top of the silicon substrate 26 by means of thermal oxidation of the silicon substrate 26. Polysilicon is then deposited, preferably by Chemical Vapor Deposition (CVD), on top of the gate oxide layer 60 to form a polysilicon gate layer 62. The polysilicon gate layer 62 is preferably about 50 to 100 nm thick.

A nitride pad 64 is then formed by depositing a layer of silicon nitride ($Si_3N_4$) ("nitride") by CVD or other means, on top of the polysilicon gate layer 62. The nitride pad 64 is preferably about 60–100 nm thick. Taken together, the gate oxide layer 60, the polysilicon gate layer 62, and the nitride pad 64 form the device layer 66.

Figure 2:
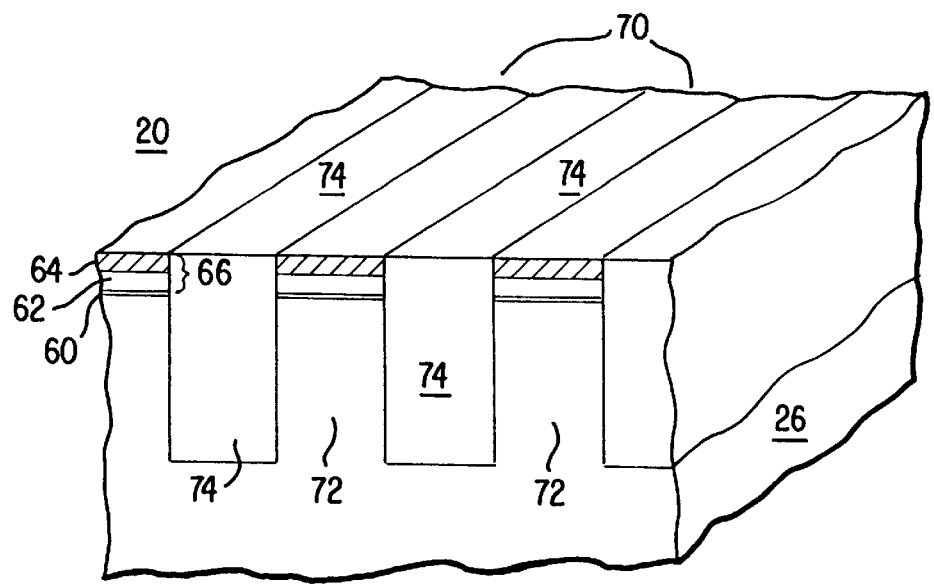
FIG. 2 is a perspective view of the device array after the formation of the silicon dioxide bars.

The next step is to define trenches in the silicon substrate 26. A resist (not shown) and mask (not shown) are applied, and photolithographic techniques are used to define the area to be etched-out. A directional etching process such as Reactive Ion Etching (RIE) is used to etch through the device layer 66 and into the silicon substrate 26 to a depth of preferably about 600 nm to form a first set of trenches 70. The first set of trenches 70 is defined by laterally-isolated bars of silicon 72 in the silicon substrate 26. After removal of the resist, the first set of trenches 70 is filled with silicon dioxide by CVD or other suitable process, to form silicon dioxide bars 74. The device array 20 is then planarized by any suitable means, such as Chemical-Mechanical Polishing (CMP), stopping on the nitride pad 64. The structure now appears as shown in FIG. 2.

Figure 3:
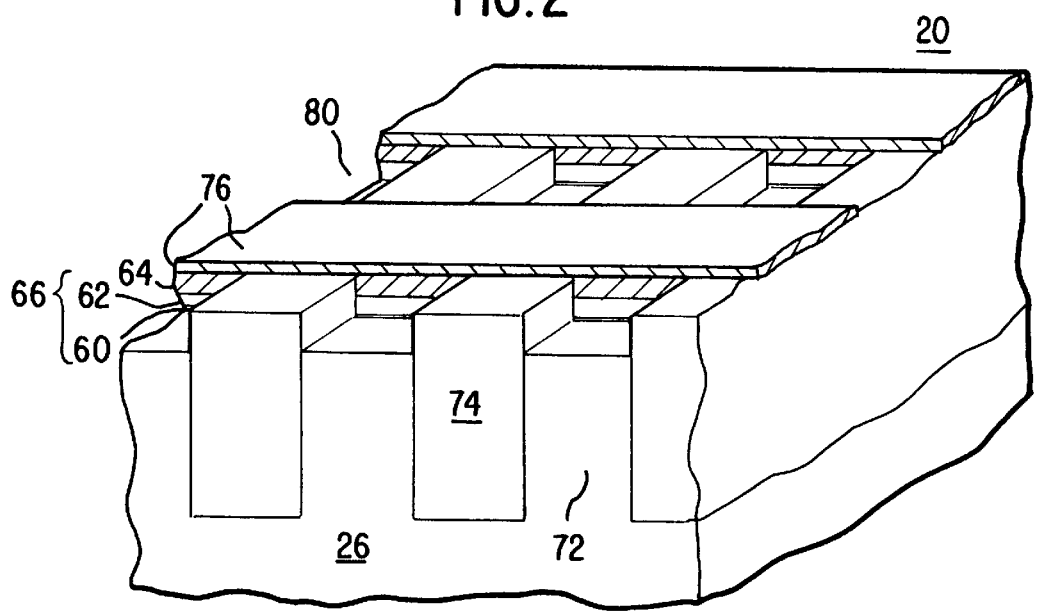
FIG. 3 is a perspective view of the device array after the definition of the second set of trenches.

A nitride masking layer 76 is applied, preferably by CVD, to a thickness of about 60–100 nm. Photolithography is used to define a second set of trenches 80 orthogonal to the first set of trenches 70. The nitride masking layer 76 and the device layer 66 are etched out by a directional etching process such as RIE to define the sides of the second set of trenches 80. Etching is continued down to the level of the silicon substrate 26, and then the resist is removed. The device array 20 now appears as shown in FIG. 3.

Next, a thermal oxide layer 82 of approximately 10 nm thickness is grown on the edges of the exposed polysilicon gate layer 62 and directionally etched to remove thermal oxide produced on horizontal surfaces of the silicon dioxide bars 74 while retaining the thermal oxide layer 82 on the edges of the exposed polysilicon gate layer 62. The thermal oxide layer 82 serves to protect the polysilicon gate layer 62 from contact with the source and drain interconnects 40, 34 during subsequent steps of the fabrication process.

Figure 4:
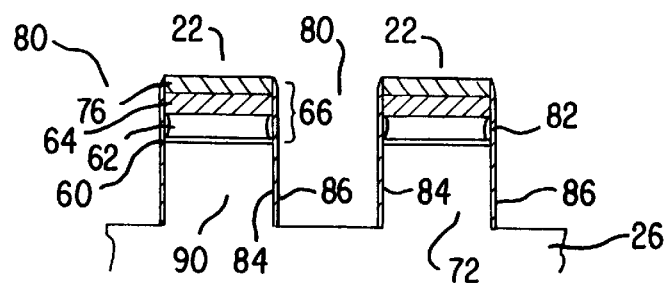
FIG. 4 is a cross-sectional view of the device array illustrating silicon islands.

The exposed silicon substrate 26 is then etched with a preferential anisotropic etchant such as a RIE to a depth of preferably about 0.3 $\mu$m+½ the island width, creating sidewalls 84. The depth should be sufficient to ensure that the silicon islands 22 will not be consumed by the thermal oxidation process in the isolation step. Now that the silicon islands 22 have been created, the next step is to isolate them from the silicon substrate 26. A nitride film 86 approximately 20 nm thick is formed on the sidewalls 84 by depositing a layer of CVD nitride and directionally etching to remove excess nitride from horizontal surfaces of the silicon dioxide bars 74 and the nitride masking layer 76. The nitride film 86 acts as an oxidation and etch barrier during subsequent steps. The structure is now as shown in FIG. 4.

Figure 5:
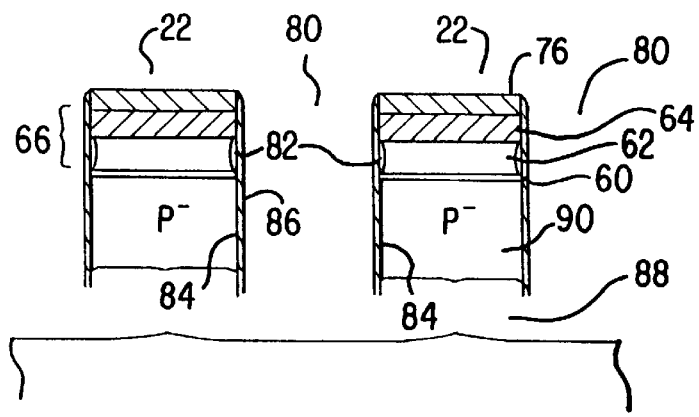
FIG. 5 is a cross-sectional view of the device array illustrating evacuated regions after the silicon islands have been undercut.

The silicon islands 22 are then fully undercut by a timed isotropic etching process that extends the second set of trenches 80 downward and laterally until the silicon islands 22 are completely undercut as shown in FIG. 5. Any suitable isotropic etchant may be used, such as a commercial etchant sold under the name CP4 (a mixture of approximately 1 part of 46% HF: 1 part $CH_3COOH$: 3 parts $HNO_3$). An isotropic etch is employed in this step to compensate for the volume of oxide to be formed in the next step. The time of the etching process is calculated to undercut the islands completely while not excessively consuming the silicon comprising the silicon islands 22. As is known, thermal oxidation produces a volume of oxide approximately twice that of the silicon consumed. Although completely undercut, the silicon islands 22 are supported by contact (bonding) with the silicon dioxide bars 74. Each silicon island 22 retains a quantity of silicon attached to the bottom of the device layer 66 that forms a device base 90, and the space between the device base 90 of each silicon island 22 and the silicon substrate 26 defines an evacuated region 88.

Figure 6:
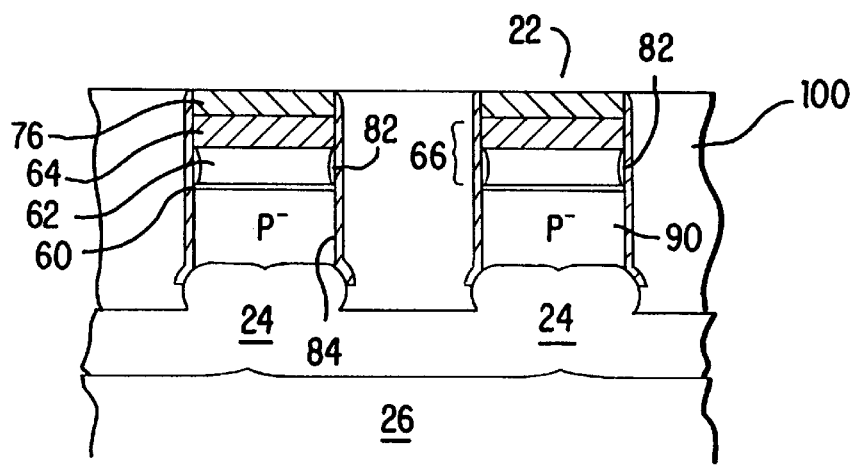
FIG. 6 is a cross-sectional view of the device array after the formation of the insulation layer.

The evacuated regions 88 are then filled with an insulation layer 24 by thermally oxidizing the exposed silicon substrate 26 and the device bases 90. The insulation layer 24 horizontally isolates the silicon islands 22 from the silicon substrate 26, as seen in FIG. 6. A suitable oxidation process can be performed in a standard silicon processing furnace at a temperature of approximately 900 to 1100 degrees Celsius. A wet, oxidizing ambient is used in the furnace chamber to oxidize the exposed silicon substrate 26 and the device bases 90 in a parallel direction to the surface of the silicon substrate 26. The oxidation time is selected to cause the evacuated regions 88 to be filled. As the desired width of the silicon islands 22 decreases, so does the required oxidation time. For example, for sub-micron technology the oxidation time is approximately 3 to 4 hours. For sub-0.25 micron technology, the oxidation time is approximately 1 hour.

Because no silicon filaments connect the silicon islands 22 to the silicon substrate 26 during thermal oxidation, tensile stress-induced crystal damage is minimized and preferably eliminated at the silicon/oxide interface. Furthermore, dislocation of the silicon islands 22 due to tensile stress is also minimized or eliminated because the silicon islands 22 are bonded into position by the silicon dioxide bars 74. The second set of trenches 80 are then filled with polysilicon, preferably intrinsic polysilicon, i.e., purified and undoped polysilicon, by CVD or other suitable process, and subsequently the device array 20 is planarized, preferably by CMP, to form intrinsic polysilicon blocks 100, as shown in cross section FIG. 6.

Figure 7:
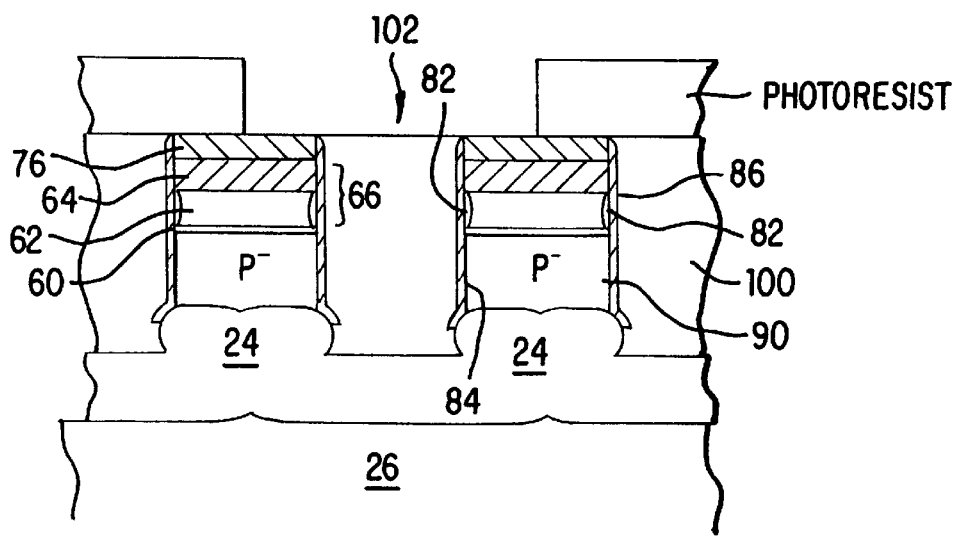
FIG. 7 is a cross-sectional view of the device array illustrating the location of the source trenches.

Source trenches 102 are then defined by photolithography, and subsequent etching of the intrinsic polysilicon blocks 100, as shown in FIG. 7. The source trenches 102 are formed by etching out alternate trenches of the second set of trenches 80, and are defined by sidewalls 84, as shown in FIG. 3. The source trenches 102 extend through the intrinsic polysilicon blocks 100 to expose the insulation layer 24 and the nitride film 86. After the resist is removed, the nitride film 86 is removed from the exposed trench sidewalls 84, preferably by isotropic etching with a nitride etchant such as phosphoric acid.

Figure 8:
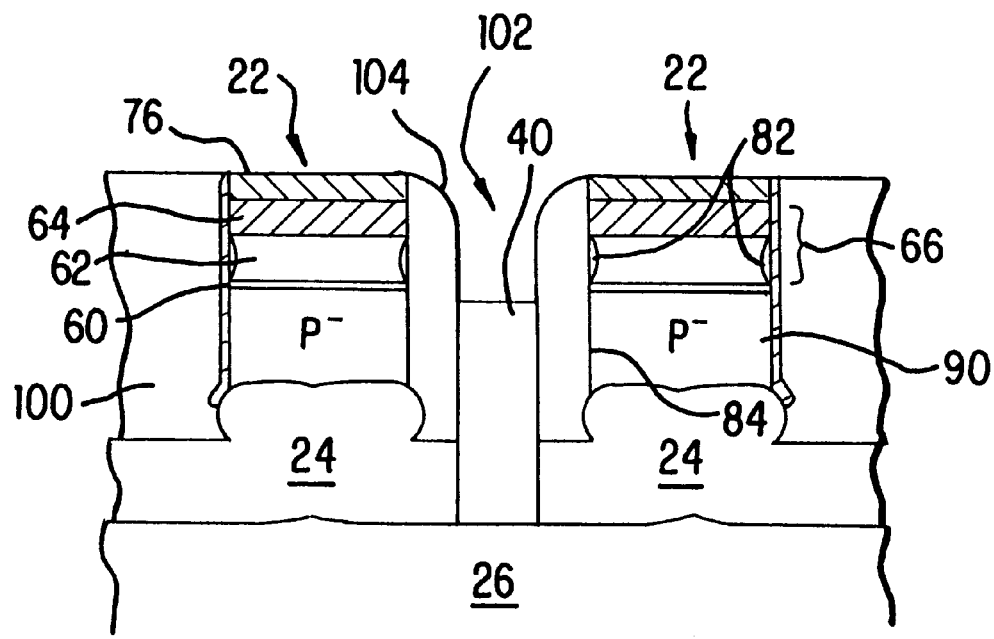
FIG. 8 is a cross-sectional view of the device array illustrating the electrical contact plug.

With reference to FIG. 8, a polysilicon liner 104 abutting the sidewalls 84, approximately 50 nm thick, is then formed by deposition of doped polysilicon, preferably by CVD. The nature of the dopant in the deposited polysilicon will vary depending on the nature of the device array 20 to be formed. For example, if the device array 20 will be an NMOS, the polysilicon will be n-doped. A short thermal anneal sufficient to drive dopant from the polysilicon liner 104 into the sides of the exposed device bases 90 is then performed, forming source n-regions 30 of the silicon islands 22.

The source trenches 102 are then cleaned out by directionally etching to remove the polysilicon liner 104 from all horizontal surfaces of the device array 20. A timed directional etch of the insulation layer 24 is then performed to expose the silicon substrate 26 at the bottom of the source trench 102. Overetch should be minimized because this etching process can also attack the exposed silicon dioxide bars 74 to the same depth.

A contact plug 40 is then formed between the silicon substrate 26 and the polysilicon liner 104, preferably by chemical vapor deposition of refractory metal (not shown) to fill the source trenches 102. A timed selective etch such as RIE is then performed to recess the electrical contact plug 40 and to clear off any metal which was deposited on the top of the silicon dioxide bars 74.

In addition, to prevent undesirable rectification which may result from inadvertent formation of a Schottky diode, the contact plug 40 is preferably comprised of refractory metal. Any refractory metal such as tungsten, titanium, tantalum or molybdenum is suitable for forming the contact plug 40, but tungsten is preferred. A cross-section of the device array 20 at this point in the process is shown in FIG. 8.

The next step is to remove excess polysilicon by isotropic etching of exposed portions of the polysilicon liners 104 so that they are recessed below the level of the polysilicon gate layer 62. This etch will have the side effect of partially recessing the intrinsic polysilicon blocks 100 across the device array 20. Next, silicon dioxide is deposited to form oxide filler 106, and subsequently planarized. Any suitable deposition method may be used, such as CVD, and any effective planarization method such as CMP is suitable for use.

Drain trenches 108 are next defined by photolithography to mask the remaining alternate trenches of the second set of trenches 80. Directional etching is used to remove the oxide filler 106, and to clean out the drain trench 108 to the approximate level of the bottom of the silicon islands 22. A selective etch is then used to remove any remaining polysilicon from the intrinsic polysilicon blocks 100.

A resist and programming mask are then applied to define contacted devices 36 and non-contacted devices 38. The resist (not shown) covers the contacted devices 36 during this step. An isotropic etch is performed to remove the nitride film 86 from the sidewalls 84 of the non-contacted devices 38. The resist is removed, and a thermal oxide liner 110 is formed by growing thermal oxide on the sidewall 84 portions abutting the device bases 90 of the non-contacted devices 38. The thermal oxide liner is approximately 50 nm thick.

Figure 9:
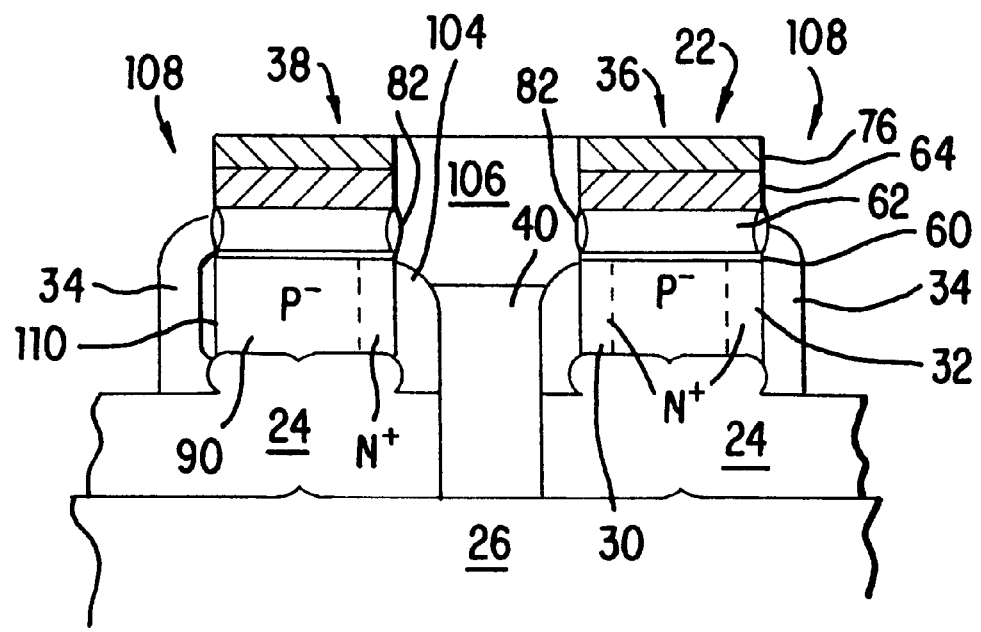
FIG. 9 is a cross-sectional view of the device array illustrating the polysilicon drain lines.

Isotropic etching is then performed to remove any remaining nitride film 86 from the sidewalls 84. Doped polysilicon (not shown) is deposited by chemical vapor deposition, and directional etching, such as RIE, is performed to remove polysilicon from horizontal surfaces of the device array 20, and to recess the polysilicon to the approximate level of the top of the polysilicon gate layer 62. The remaining doped polysilicon forms polysilicon drain lines 34 abutting the sidewalls 84. An annealing process is then performed to drive dopant from the polysilicon drain lines 34 into the sides of the exposed device bases 90 of the contacted devices 36, forming n-region drains 32. The non-contacted devices 38 are not doped in this step because of the protective thermal oxide liner 110. The device array at this stage is shown in FIG. 9.

The device array 20 then undergoes a finishing process. The drain trenches 108 are filled with silicon oxide and the surface of the device array is planarized, by CVD and CMP, respectively, or other suitable processes. Selective etching with hot phosphoric acid or another suitable etchant is then performed to remove the nitride masking layer 76 and the nitride pad 64 from the top surface of the silicon islands 22. Conventional processing methods may then be used to form contact holes and metal wiring to connect gate lines and to equip the device array 20 for peripheral circuits. The final structure of the device array 20 is as shown in FIG. 1.

The process sequence described and illustrated above provides for the formation of minimum dimension programmable devices of one carrier type. It follows that devices of either carrier type may be made on the same chip by substitution of the appropriately doped materials and addition of appropriate masks. In addition, implanted source/drain devices may be fabricated on the same chip by process integration with common process steps.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of fabricating a silicon-on-insulator structure on a substrate comprising the steps of:

defining fully undercut silicon islands in the substrate which are laterally spaced apart from each other and are supported by non-conductive bars extending to the substrate;

forming an insulating layer between the silicon islands and the substrate;

doping the sides of the silicon islands to form source and drain regions therein;

forming source interconnects made of refractory metal between the silicon islands and abutting the source regions of the silicon islands, wherein the source interconnects extend through the insulating layer to contact the substrate; and forming drain interconnects between the silicon islands and abutting the drain regions of the silicon islands, wherein the drain interconnects are recessed below the top surface of the silicon islands.

2. The method of claim 1, wherein the silicon-on-insulator structure is a programmable logic array.

3. The method of claim 1, wherein said refractory metal is tungsten.

4. The method of claim 1, wherein the drain interconnects are formed of doped polysilicon.

5. A method for fabricating a semiconductor device array on a substrate, comprising the steps of:

forming a device layer on the substrate;

defining silicon islands in the substrate which are laterally spaced apart from each other and are bonded to non-conductive bars extending to the substrate, wherein the device layer is atop the silicon islands;

undercutting the silicon islands to define evacuated regions beneath the silicon islands;

filling the evacuated regions with an insulating layer;

forming source regions in the sides of alternate rows of the silicon islands;

forming refractory metal source interconnects between the silicon islands and abutting the source regions of the silicon islands, wherein the source interconnects extend through the insulating layer to contact the substrate;

forming a drain line on the sidewalls of at least some of the silicon islands, on the side of the silicon islands opposite the source regions, wherein the drain line is recessed below the level of the device layer on the silicon island;

forming drain regions in the silicon islands; and forming gate conductor lines connecting the device layers of adjacent silicon islands in a direction orthogonal to the drain line.

6. The method of claim 5, wherein source regions are formed through a process of forming a doped polysilicon liner on the sidewalls of alternate rows of the silicon islands, and forming source regions in the silicon islands by annealing sufficient to drive dopant from the polysilicon liner into the silicon islands.

7. The method of claim 5, wherein the device layer is formed by successive formation of a gate oxide layer, a polysilicon gate layer, and a nitride pad.

8. The method of claim 5, wherein the undercutting step comprises timed isotropic etching.

9. The method of claim 5, wherein the evacuated regions are filled by thermal oxidation of the substrate.

10. The method of claim 5, wherein the source interconnect refractory metal is tungsten.

11. A method for fabricating a semiconductor device array on a substrate, comprising the steps of:

forming a device layer on the substrate;

defining a first set of trenches in the substrate and extending through the device layer;

filling the first set of trenches with silicon dioxide to form silicon dioxide bars;

defining a second set of trenches in the substrate which extend through the device layer in a direction orthogonal to the first set of trenches to form silicon islands defined by the silicon dioxide bars and the second set of trenches;

undercutting the silicon islands to define evacuated regions beneath the silicon islands;

filling the evacuated regions with silicon dioxide;

doping the sides of the silicon islands exposed by the second set of trenches to form source and drain regions therein;

forming refractory metal contact plugs in alternate trenches of the second set of trenches abutting the source regions of the silicon islands and contacting the substrate; and forming polysilicon drain lines in alternate trenches of the second set of trenches abutting the drain regions of the silicon islands, wherein said polysilicon drain lines are recessed below the top surface of the silicon islands.

12. The method of claim 11, wherein the device layer is formed by successive formation of a gate oxide layer, a polysilicon gate layer, and a nitride pad.

13. The method of claim 11, wherein the etching process used to define the first and second set of trenches is a reactive ion etch.

14. The method of claim 11, wherein the undercutting step is a timed isotropic etch.

15. The method of claim 11, wherein the substrate is a doped silicon wafer of a first conductivity type, and the doping of the silicon islands forms source and drain regions of a second conductivity type.

16. A method of fabricating a silicon-on-insulator device array on a supporting silicon substrate, comprising the steps of:

forming a device layer on the silicon substrate by successive formation of a gate oxide layer and a polysilicon gate layer;

defining a first set of trenches in the substrate and extending through the device layer;

filling the first set of trenches with an insulating material to form non-conductive bars;

defining a second set of trenches in the silicon substrate, wherein the second set of trenches extends through the device layer in a direction orthogonal to the first set of trenches to form silicon islands defined by the non-conductive bars and the sidewalls of the second set of trenches;

etching the silicon substrate to a depth of at least one-half of the width of the silicon islands;

undercutting the silicon islands to define evacuated regions underneath the silicon islands, wherein for each silicon island a portion of silicon remains attached to the bottom of the device layer and forms a device base, and the evacuated regions occupy the space between the device bases and the silicon substrate;

filling the evacuated regions with an insulating layer;

filling the second set of trenches with polysilicon to form polysilicon blocks;

defining source trenches by etching out alternate trenches of the second set of trenches, and removing the polysilicon blocks in the alternate trenches to expose the insulating layer;

forming a doped polysilicon liner abutting the sidewalls;

forming source regions by thermal annealing sufficient to drive dopant from the polysilicon liner into the sides of the device bases;

clearing out the source trenches to expose the silicon substrate;

forming an electrical contact plug between the silicon substrate and the polysilicon liner;

recessing the polysilicon liner so that it is below the level of the polysilicon gate layer;

filling the source trenches with an insulating material;

defining drain trenches by removal of the remaining polysilicon blocks, wherein said drain trenches extend through the polysilicon blocks to expose the insulating layer;

defining contacted devices and non-contacted devices;

forming an insulating liner on the sidewall portions abutting the device bases of the non-contacted devices;

forming polysilicon drain lines on the sidewalls, wherein the polysilicon drain lines are doped, and are recessed below the approximate level of the top of the polysilicon gate layer;

forming drain regions in the contacted devices by thermal annealing sufficient to drive dopant from the polysilicon drain lines into the sides of the exposed device bases of said contacted devices;

filling the drain trenches with an insulating material; and forming gate conductor lines by connecting the polysilicon gate layers of adjacent silicon islands in a direction orthogonal to the polysilicon drain lines.

17. The method of claim 16, wherein the first and second set of trenches are defined by photolithography and subsequent reactive ion etching.

18. The method of claim 16, wherein the silicon substrate is etched with a preferential anisotropic etchant.

19. The method of claim 16, wherein the silicon islands are undercut by a timed isotropic etching process.

20. The method of claim 16, wherein the source trenches are cleared out by directional etching.

21. The method of claim 16, wherein the electrical contact plug is a refractory metal.

* * * * *